United States Patent [19]

Ishihara

[11] Patent Number: 4,736,162

[45] Date of Patent: Apr. 5, 1988

[54] TIMING PULSE GENERATOR FOR GENERATING TIMING PULSES SYNCHRONIZED WITH THE HORIZONTAL SYNCHRONIZING SIGNAL IN A VIDEO SIGNAL

[75] Inventor: Shuji Ishihara, Tokyo, Japan

[73] Assignee: NEC Corporation, Tokyo, Japan

[21] Appl. No.: 768,756

[22] Filed: Aug. 23, 1985

[30] Foreign Application Priority Data

Aug. 23, 1984 [JP] Japan .................. 59-175462

[51] Int. Cl.[4] .................. H04N 5/04; H03B 1/00; H03K 5/22
[52] U.S. Cl. .................. 328/139; 328/63; 328/109; 328/179; 307/518; 358/148; 358/155
[58] Field of Search .................. 328/63, 119, 139, 109, 328/111, 179; 307/269, 518; 358/148, 149, 150, 153, 155

[56] References Cited

U.S. PATENT DOCUMENTS 4,228,433 10/1980 Matsumoto .................. 340/748
4,599,649 7/1986 Funai .................. 358/148

*Primary Examiner*—Stanley D. Miller
*Assistant Examiner*—Richard Roseen
*Attorney, Agent, or Firm*—Burns, Doane, Swecker & Mathis

[57] ABSTRACT

A timing pulse generator comprises a flip-flop set by a gate pulse (or a horizontal synchronizing pulse), a NAND gate receiving an inverted gate pulse and an inverted output of the flip-flop, an oscillator controlled by the output from the NAND gate and producing a first clock pulse, a means for producing a second clock pulse in response to the first clock pulse to clock the flip-flop, and a counter counting the first clock pulse and being reset by the output from the flip-flop.

13 Claims, 4 Drawing Sheets

TIMING PULSE GENERATOR FOR GENERATING TIMING PULSES SYNCHRONIZED WITH THE HORIZONTAL SYNCHRONIZING SIGNAL IN A VIDEO SIGNAL

BACKGROUND OF THE INVENTION

1. Field of the Invention

The present invention relates to a timing pulse generator for generating timing pulses synchronized with a horizontal synchronizing signal which is contained in a TV video signal or another video signal for CRT display. Such timing generator may be used in a superimposing apparatus which superimposes display signals of letters, characters or the like on a video signal and displays them together with a video image on a cathode ray tube. One example of such superimposition is to display the receiving channel number or sound level on a TV program display. Another example is a teletext in which selected one among a plurality of information transmitted from a broadcasting station is superimposed in a TV display transmitted under control of a receiver.

2. Description of the Prior Art

A prior art timing pulse generator comprises a generator of clock pulses synchronized with a horizontal synchronized signal which is separated from the video signal, the clock pulses having a frequency of 300 to 400 times of the horizontal synchronizing signal, and a counter counting the clock pulses to define the superimposing position on one scanning line. The position corresponding to the predetermined numbers of the clock signal is the superimposing position. The counter is reset by the horizontal synchronizing signal to recount the clock pulses to determine the superimposing position on the next scanning line. The generator further comprises a timing generator which counts the clock pulses and produces a timing signal such as a readout timing signal to be applied to a memory which stores display elements of the letters or the characters to be displayed on a CRT in superimposition of a video image. The timing generator is also reset by the horizontal synchronizing signal to produce a next timing signal.

As mentioned above, the counter and the timing generator are reset by the horizontal synchronizing signal as a gate pulse in the prior art. If the horizontal synchronizing signal includes a spike noise or does not have a sufficient waveform, resetting of the clock counter and the timing generator becomes imperfect, and the counter miscounts the superimposing position and the timing generator misreads the memory, resulted in a disturbance of superimposed letters or characters.

SUMMARY OF THE INVENTION

Therefore, the primary object of the present invention is to provide a timing pulse generator generating timing pulses in synchronism with a gate pulse which is not adversely affected by a gate pulse having an insufficient pulse width or by a spike noise.

Another object of the invention is to provide a timing pulse generator which is simple in a circuit design and easy to be formed as an integrated circuit with low cost.

According to the present invention, there is provided a timing pulse generator which comprises a gated clock oscillator generating clock pulses and starting the generation of the clock pulses in synchronism with a gate pulse, a timing pulse generating circuit receiving the clock pulses and generating in response to the clock pulses a timing pulse, means for shaping the waveform of the gate pulse to generate a waveform-shaped gate pulse by using the clock pulses, means for stopping the oscillation of the gated clock generator by using the waveform-shaped gate pulse, and means for resetting the timing pulse generating circuit by the waveform-shaped gate pulse.

In a preferred embodiment, the timing pulse generator comprises an input terminal receiving gate pulses, a flip-flop having an input end connected with the input terminal, a reset input end, an output end and an inverted output end, a NAND gate detecting both low levels of the gate pulse and the output from the flip-flop, an oscillator generating a first clock pulse, the oscillation of the oscillator being controlled by the output from the NAND gate, a means for producing a second clock pulse on a base of the first clock pulse, the second clock pulse being applied to the reset input end of the flip-flop to reset the flip-flop, a clock counter counting the number of the first clock pulses and being reset by the obtained output of the flip-flop, and a timing generator receiving the first clock pulse, generating a timing signal and being reset by the output of the flip-flop.

This embodiment uses the flip-flop as a wave-shaper. The flip-flop is set by the gate pulses and reset by the second clock pulse produced by the first clock pulse. It may be reset by the first clock pulse. Therefore, if the gate pulse becomes low level, the oscillator continues to oscillate until the flip-flop is reset, resulting in keeping the wave-shaper operation of the flip-flop. The circuit arrangement for keeping the wave-shaper operation requires only the NAND gate.

The timing pulse generator according to the present invention keeps correct operation with a simple circuit arrangement and low cost, even if the horizontal synchronizing signal which is used as the gate pulse is deformed by noise or weakness of the received TV signal. Furthermore, the simple circuit arrangement enables the formation of the circuit as a whole on an integrated circuit chip.

BRIEF DESCRIPTION OF THE DRAWINGS

The above and further objects, features and advantages of the present invention will become more apparent from the following detailed description taken in conjunction with the accompanying drawings, wherein.

Figure 1:
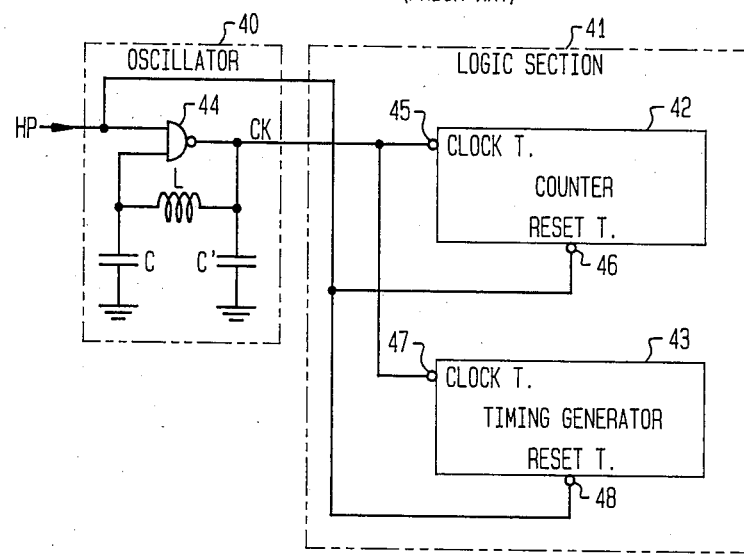
FIG. 1 is a block diagram showing a timing pulse generator in the prior art for superimposing letters and/or characters on a video image on a CRT screen.

The conventional pulse generator shown in FIG. 1 is composed of a gated oscillator circuit 40 and a logic section 41. The gated oscillator circuit 40 receives a horizontal synchronizing pulse (hereinafter referred to as a gate pulse) HP. During the high level period of the gate pulse HP, the oscillator 40 generates clock pulses CK having a repetition frequency of 300 to 400 times higher than that of the gate pulse HP. The oscillator 40 includes a NAND gate 44 having one input end receiving the gate pulse HP, another input end and an output end, an inductor L interposed between the other input end and the output end, a first capacitor C connected between the other input end and a grounding point and a second capacitor C' connected between the output end and the grounding point.

The logic section 41 includes a clock counter 42 having a clock terminal 45 receiving the clock pulse CK from the output end of the NAND gate 44 and a reset terminal 46 receiving the gate pulse HP and a timing generator 43 having a clock terminal 47 receiving the clock pulse CK from the output end of the NAND gate 44 and a reset terminal 48 receiving the gate pulse HP. The clock counter 42 counts the clock pulse CK for determining the position where the letters and/or characters are superimposed. The letters and/or characters to be superimposed at the position determined by the clock counter 42 is stored in RAM (not shown) that is controlled by the timing generator 43.

The gate pulse HP is a horizontal synchronizing pulse which is transmitted from the broadcasting station and is feasible to change its phase and to be affected by noise. If the phase of the gate pulse HP is changed, the counter 42 and the timing generator 43 are reset at a wrong timing and the letters and characters are distributed from being superimposed on the display screen. If the noise is inserted between the gate pulses HP, the counter 42 and the timing generator 43 are also reset at a wrong timing. If the width of the gate pulse HP becomes narrow, the reset of the counter 42 and the timing generator 43 cannot be made sufficiently. The imperfect reset disturbs the counting operation of the counter with a result of disturbed letters and/or characters on the display screen, and causes a misreading of the RAM.

As a solution to the above-mentioned drawbacks, one attempt has been considered to synchronize the gate pulse HP with the clock pulse CK by a wave-shaper prior to its application to the reset terminals 46 and 48. The generator 40, however, stops oscillation in response to the low level of the gate pulse HP. Therefore, since the clock pulse CK disappears when the gate pulse HP is at low level, such attempt cannot be a solution to the above-mentioned problem.

DESCRIPTION OF THE PREFERRED EMBODIMENT

Figure 2:
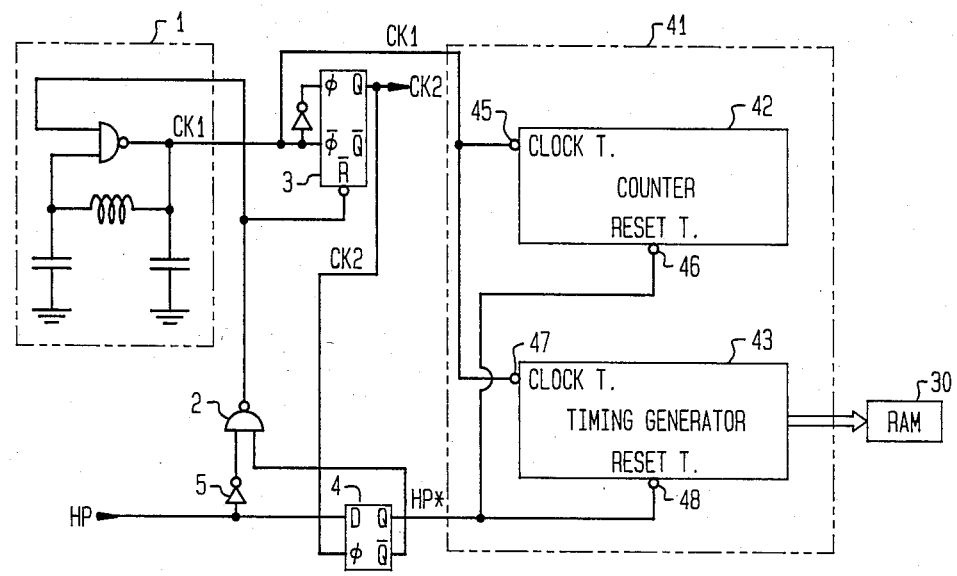
FIG. 2 is a block diagram showing a preferred embodiment of the present invention.

The preferred embodiment of the present invention is shown in FIG. 2 in block diagram form. The gate pulse (or a horizontal synchronizing pulse) is applied to a D-input of a D-type flip-flop 4 which has a Q-output, a $\bar{Q}$ output and a $\phi$ (or clock) input, and also to an inverter 5. A NAND gate 2 receives an inverted gate pulse from the inverter 5 and the $\bar{Q}$-output from flip-flop. Oscillation of a gated oscillator 1 is controlled by the output of the NAND gate 2. The oscillator 1 is composed of a NAND gate having a first input connected with the output of the NAND gate 2, an inductor connected between the second input and the output of the NAND gate, a first capacitor connected between the second input of the NAND gate and a grounding potential and a second capacitor connected between the output of the NAND gate and the grounding potential. The NAND gate in the oscillator 1 outputs a first clock pulse CK1 having a repetition frequency 300 to 400 times higher than the gate pulse HP. The obtained first clock pulse CK1 is applied to a $\bar{\phi}$-input of a binary flip-flop 3 and to a $\phi$-input of the same through an inverter. The binary flip-flop 3 has a reset terminal $\bar{R}$ receiving the output from the NAND gate 2 to be reset.

At a Q-output of the binary flip-flop 3, a second clock pulse CK2 having a half repetition frequency of the first clock pulse CK1 is generated and is applied to the $\phi$ (or clock)-input of the D-type flip-flop 4. The logic section 41 is similar to that in the prior art shown in FIG. 1 and includes a counter 42 for determining a position of letters and/or characters to be superimposed and a timing generator 43 producing a timing to read a RAM 30 storing the letters and/or characters. The first clock pulse CK1 is applied to clock terminals 45 and 47 of the counter 42 and the timing generator 43. A reformed gate pulse HP* obtained at the Q-output of the D-type flip-flop 4 is applied to the reset terminal 46 and 48 of the counter 42 and the timing generator 43. The timing generator 43 is formed of a counter, for example.

Figure 3:
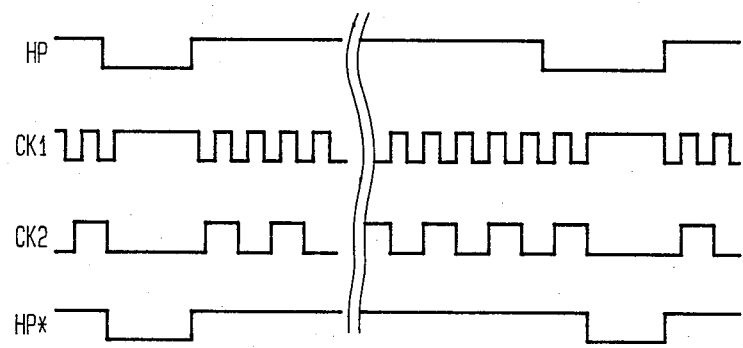

Referring also to FIG. 3, when the gate pulse HP becomes high level "H", the oscillator 1 starts oscillation irrespective of the signal state at the $\bar{Q}$-output of the D-type flip-flop 4 to generate the first clock pulse CK1. The first clock pulse CK1 is transformed to the second clock pulse CK2 by being divided by two by the binary flip-flop 3. The gate pulse HP is input into the D-type flip-flop 4 in response to the second clock pulse CK2 to produce the reformed gate pulse HP* in synchronism with the second clock pulse CK2. This reformed gate pulse HP* is applied to the reset terminals 46 and 48 of the counter 42 and the timing generator 43. Thus waveshaper operation can be achieved by the NAND gate 2, the inverter 5 and the binary flip-flop 3 in addition to the D-type flip-flop 4 as a wave-shaper.

Figure 4:
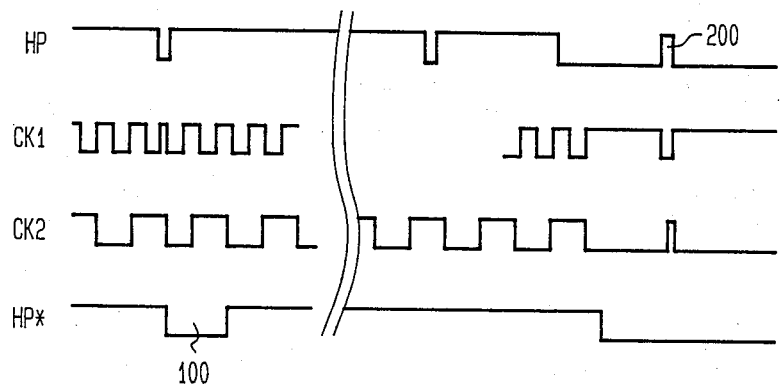
FIGS. 3 and 4 are wave forms for explaining the operation of the preferred embodiment shown in FIG. 2.

Referring also to FIG. 4, if the width of the gate pulse HP becomes short, the output of the D-type flip-flop 4 is made low by the low level of the gate pulse HP and the falling edge of the second clock pulse CK2 and the output is made high by the high level of the gate pulse HP and the falling edge of the second clock pulse CK2. Thus sufficient width 100 of the reformed gate pulse HP* can be obtained as shown in FIG. 4. If a noise 200 is contained in the gate pulse HP during the period existing no descent of the second clock pulse CK2, no reformed gate pulse is produced as shown in FIG. 4. This means that there is little chance to produce the reformed gate pulse HP* in response to noise.

Figure 5:
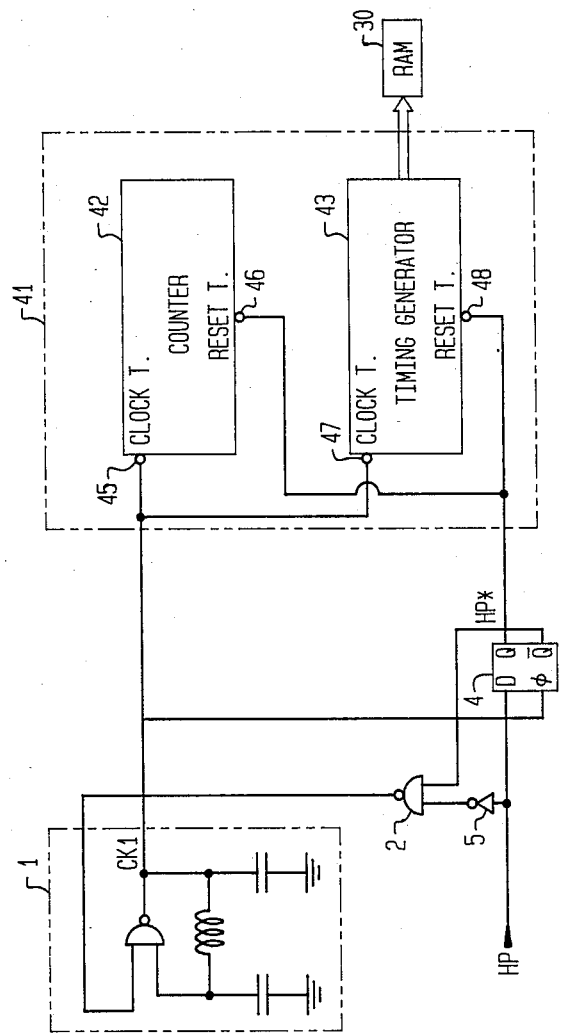
FIGS. 5 and 6 are block diagrams showing modifications of the preferred embodiment of the present invention shown in FIG. 2.
Figure 6:
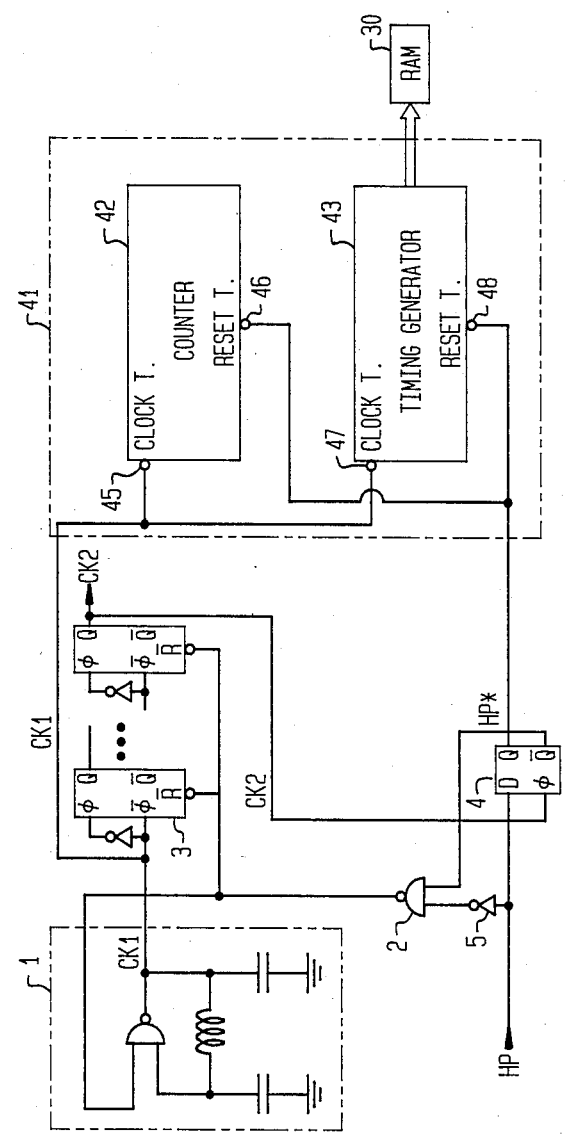

Thus, according to the preferred embodiment of the present invention, a reliable reset of the counter 42 and the timing generator 43 can be maintained irrespective of changes in phase and width of the gate pulse and applied noise. Furthermore, the second clock pulse CK2 may be replaced with the first clock pulse CK1 with removal of the binary flip-flop 3, as shown in FIG. 5. This is because, if the gate pulse HP becomes low level "L", the oscillator 1 continues to oscillate until the D-type flip-flop 4 is reset by the first clock pulse CK1. Plural number of the binary flip-flops 3 may be connected in series to obtain the second clock pulse CK2, as shown in FIG. 6. The number of the binary flip-flop 3 is determined by the required width of the second clock pulse CK2. Furthermore, the combination of the inverter 5 and the NAND gate 2 may be replaced with an OR gate receiving the gate pulse HP and the reformed gate pulse HP*. It is needless to say that the oscillator 1 using an inductor L and capacitors C may be replaced with any oscillator the oscillation of which is controlled.

I claim:
1. A timing pulse generator comprising:
an input terminal receiving a gate pulse;

a flip-flop having a set input portion, a clock input portion, an output portion and an inverted output portion and being set by said gate pulses in response to clock pulses applied to said clock input portion;

an inverter inverting said gate pulses;

a NAND gate receiving an output of said inverter and an inverted output from said inverted output portion of said flip-flop;

an oscillator whose oscillation is controlled by an output of said NAND gate, said oscillator having an output portion and generating clock pulses at said output portion thereof;

means for transferring said clock pulses to said clock input portion of said flip-flop to produce shaped gate pulses at said output portion of said flip-flop; and a counter receiving said clock pulses and counting said clock pulses, said counter being reset by said shaped gate pulses.

2. A timing pulse generator as claimed in claim 1, wherein said transferring means includes a binary flip-flop dividing a repetition frequency of said clock pulses.

3. A timing pulse generator as claimed in claim 1, wherein said transferring means includes a series connection of binary flip-flops dividing a repetition frequency of said clock pulses.

4. A timing pulse generator as claimed in claim 1, wherein said transferring means includes a connecting wire between an output portion of said oscillator and said clock input portion of said flip-flop.

5. A timing pulse generator as claimed in claim 1, wherein said oscillator generates said clock pulses having a repetition frequency 300 to 400 times higher than a repetition frequency of said gate pulses.

6. A timing pulse generator as claimed in claim 2, wherein said oscillator generates said clock pulses having a repetition frequency 300 to 400 times higher than a repetition frequency of said gate pulses.

7. A pulse generator comprising:

an input terminal receiving gate pulses;

a flip-flop being set by said gate pulses and having an output end and a clock input end;

an OR gate receiving said gate pulses and an output produced at said output end of said flip-flop;

an oscillator whose oscillation is controlled by an output of said OR gate, said oscillator generating clock pulses;

a means for transferring said clock pulses to said clock input end of said flip-flop to clock said flip-flop; and a counter receiving said clock pulses and counting said clock pulses, said counter being reset by said output produced at said output end of said flip-flop.

8. A timing pulse generator comprising:

an input terminal receiving horizontal synchronizing pulses contained in a video signal;

a flip-flop having a clock input portion, an output portion and an inverted output portion and being set by said horizontal synchronizing pulses in response to clock pulses applied to said clock input portion;

an inverter inverting said horizontal synchronizing pulses;

a NAND gate receiving an output of said inverter and an inverted output from said inverted output portion of said flip-flop;

an oscillator whose oscillation is controlled by an output of said NAND gate, said oscillator having an output portion at which clock pulses having a repetition frequency 300 to 400 times higher than a repetition frequency of said horizontal synchronizing pulses are generated;

means for transferring said clock pulses to said clock input portion of said flip-flop to produce shaped gate pulses at said output portion of said flip-flop, said transferring means including a binary flip-flop dividing said clock pulses; and a counter receiving said clock pulses and counting said clock pulses, said counter being reset by said shaped gate pulses.

9. A pulse generator comprising:

an input terminal receiving gate pulses;

a flip-flop being set by said gate pulses and having an output end and a clock input end;

an OR gate receiving said gate pulses and an output produced at said output end of said flip-flop;

an oscillator whose oscillation is controlled by an output of said OR gate, said oscillator generating clock pulses having a repetition frequency 300 to 400 times higher than said gate pulses;

a means for transferring said clock pulses to said clock input end of said flip-flop to clock said flip-flop; and a counter receiving said clock pulses and counting said clock pulses, said counter being reset by said output produced at said output end of said flip-flop.

10. A pulse generator comprising:

an input terminal receiving gate pulses;

a flip-flop being set by said gate pulses and having an output end and a clock input end;

an OR gate receiving said gate pulses and an output produced at said output end of said flip-flop;

an oscillator whose oscillation is controlled by an output of said OR gate, said oscillator generating clock pulses;

a means for transferring said clock pulses to said clock input end of said flip-flop to clock said flip-flop, said transferring means including a binary flip-flop dividing said clock pulses to two; and a counter receiving said clock pulses and counting said clock pulses, said counter being reset by said output produced at said output end of said flip-flop.

11. A pulse generator comprising:

an input terminal receiving gate pulses;

a flip-flop being set by said gate pulses and having an output end and a clock input end;

an OR gate receiving said gate pulses and an output produced at said output end of said flip-flop;

an oscillator whose oscillation is controlled by an output of said OR gate, said oscillator generating clock pulses;

a means for transferring said clock pulses to said clock input end of said flip-flop to clock said flip-flop, said transferring means including a series connection of binary flip-flops dividing said clock pulses; and a counter receiving said clock pulses and counting said clock pulses, said counter being reset by said output produced at said output end of said flip-flop.

12. A pulse generator comprising:

an input terminal receiving gate pulses;

a flip-flop being set by said gate pulses and having an output end and a clock input end;

an OR gate receiving said gate pulses and an output produced at said output end of said flip-flop;

an oscillator whose oscillation is controlled by an output of said OR gate, said oscillator generating clock pulses;

a means for transferring said clock pulses to said clock input end of said flip-flop to clock said flip-flop, said transferring means including a connecting wire applying said clock pulses to said clock input end of said flip-flop; and a counter receiving said clock pulses and counting said clock pulses, said counter being reset by said output produced at said output end of said flip-flop.

13. A timing pulse generator comprising:

an input terminal receiving gate pulses which have first and second potential levels;

a gated clock oscillator generating clock pulses, said oscillator starting the oscillation in synchronism with said first potential level of said gate pulses;

a counter receiving said clock pulses and counting said clock pulses;

means responsive to said clock pulses for shaping the waveform of said gate pulses to produce shaped gate pulses having third and fourth potential levels;

means for stopping the oscillation of said oscillator in response to a state where said gate pulses and said shaped gate pulses are respectively in said second potential level and said fourth potential level; and means for resetting said counter by the output of said shaping means in response to said fourth potential level of said shaped gate pulses.

* * * * *